US007013430B2

(12) United States Patent
Jaffe

(10) Patent No.: US 7,013,430 B2
(45) Date of Patent: Mar. 14, 2006

(54) RAPID GRAPHICAL ANALYSIS OF WAVEFORMS USING A POINTING DEVICE

(75) Inventor: Stanley Edward Jaffe, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 554 days.

(21) Appl. No.: 10/056,876

(22) Filed: Jan. 25, 2002

(65) Prior Publication Data

US 2003/0142142 A1 Jul. 31, 2003

(51) Int. Cl.
*G06F 3/14* (2006.01)
*G06F 17/00* (2006.01)

(52) U.S. Cl. ...................... 715/771; 715/856; 715/810; 702/68; 702/67; 345/440.1

(58) Field of Classification Search ................. 702/66, 702/123, 67, 68, 117, 119, 124, 125, 70, 75, 702/76; 345/780, 440, 440.1; 704/254; 715/780, 856, 771, 970, 964, 810, 841, 843
See application file for complete search history.

(56) References Cited

U.S. PATENT DOCUMENTS

| | | | | |
|---|---|---|---|---|
| 4,812,996 | A * | 3/1989 | Stubbs | 702/123 |
| 4,813,076 | A * | 3/1989 | Miller | 704/254 |
| 4,820,059 | A * | 4/1989 | Miller et al. | 704/254 |
| 5,129,722 | A * | 7/1992 | Mader et al. | 345/440.1 X |
| 5,381,524 | A * | 1/1995 | Lewis et al. | 345/804 |
| 6,201,384 | B1 * | 3/2001 | Alexander | 715/856 X |
| 6,229,536 | B1 * | 5/2001 | Alexander et al. | 345/440.1 |
| 6,502,045 | B1 * | 12/2002 | Biagiotti | 702/66 |
| 6,522,345 | B1 * | 2/2003 | Alexander | 715/771 |
| 6,529,842 | B1 * | 3/2003 | Williams et al. | 702/66 |
| 2002/0063712 | A1 * | 5/2002 | Ilic | 345/440 |

OTHER PUBLICATIONS

User's Guide Agilent Technologies ESA Series Spectrum Analyzers, available from Agilent Technologies as Manufacturing Part No. E4401-90236, Dec. 2001, pp. 111-113.

* cited by examiner

*Primary Examiner*—Raymond J. Bayerl

(57) ABSTRACT

A signal waveform is displayed on a display. In response to a user using a pointing device to select a location on the display, values for a selected parameter of the displayed signal waveform are adjusted based on locations on the display selected by the user using the pointing device.

17 Claims, 7 Drawing Sheets

RAPID GRAPHICAL ANALYSIS OF WAVEFORMS USING A POINTING DEVICE

BACKGROUND

The present invention concerns displays used for electronic instruments and other devices and pertains particularly to rapid graphical analysis of waveforms using a pointing device.

A spectrum analyzer displays the amplitude of signals on the vertical (y) axis and frequency on the horizontal (x) axis. For some existing spectrum analyzers, when observing a measured signal, the displayed frequency component can be adjusted using start, stop, center or span controls. This is typically accomplished using a knob, step keys or direct numerical input. Generally, varying any of these parameters requires several steps and is not immediately intuitive. For example, to zoom in on a specific signal typically requires alternating between the center and span controls.

For further information on how center, start, stop and span controls work on existing spectrum analyzers, see for example, the User's Guide Agilent Technologies ESA Series Spectrum Analyzers, available from Agilent Technologies as Manufacturing Part Number E4401-90236, December 2001, pages 111–113.

SUMMARY OF THE INVENTION

In accordance with the preferred embodiment of the present invention, a signal waveform is displayed on a display. In response to a user using a pointing device to select a location on the display, values for a selected parameter of the displayed signal waveform are adjusted based on locations on the display selected by the user using the pointing device.

DESCRIPTION OF THE PREFERRED EMBODIMENT

Figure 1:
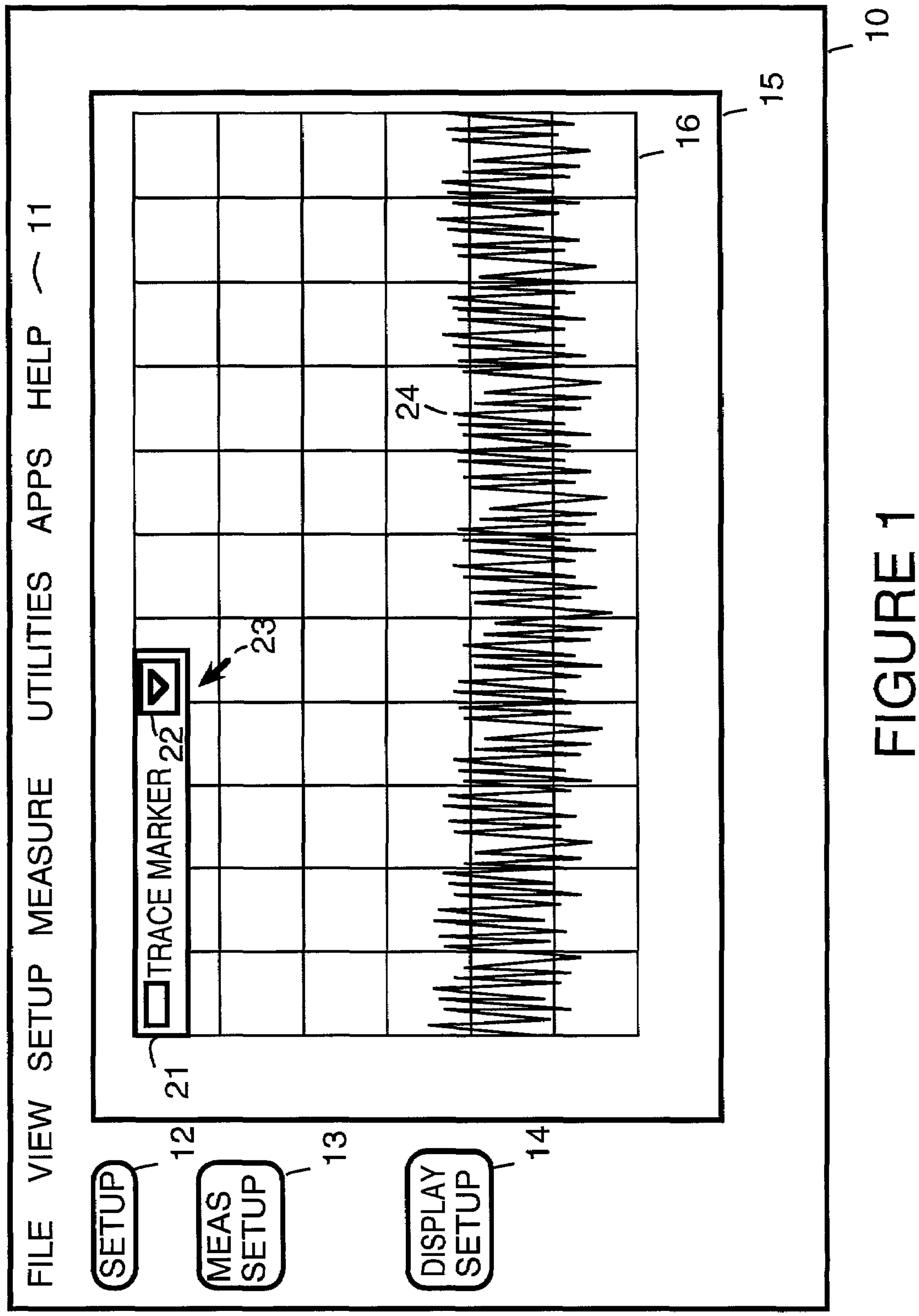
FIG. 1 shows a simplified display from a multi-wavelength meter that shows a selected parameter on a pull down menu that may be varied using a pointing device in accordance with a preferred embodiment of the present invention.

FIG. 1 shows a simplified display 10 from a multi-wavelength meter that shows the selected parameter "trace marker" on a pull down menu 21. The complete pull down menu displayed by using a pointing device, represented by a cursor 23, to select button 22. The pointing device is, for example, a mouse, trackball, touchpad, and so on. Alternatively, the pointing device can be implemented using a touchscreen implementation of display 10, cursor keys, or by any other means that allows selecting elements on a display.

Display 10 includes a grid 16 within a window 15. On grid 16 is displayed a measured signal 24. Also shown within display 10 are a menu 11, a button 12, a button 13 and a button 14.

Figure 2:
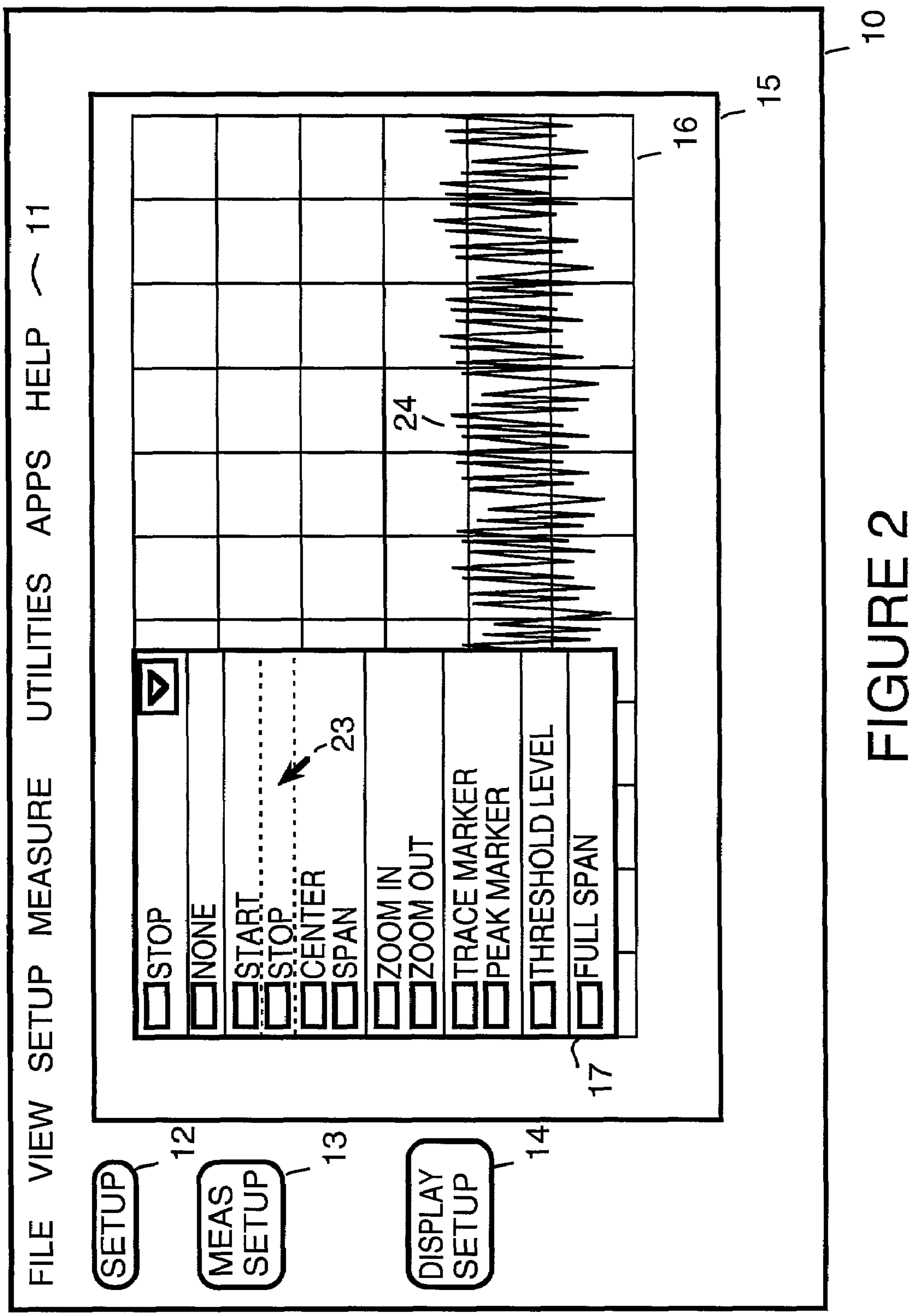
FIG. 2 shows a simplified display from a multi-wavelength meter that shows a complete menu listing parameters that may be varied using a pointing device in accordance with a preferred embodiment of the present invention.

FIG. 2 shows the result when button 22 is selected by the pointing device. A full menu 17 is shown. On menu 17 are listed various parameters that may be varied using a pointing device. Shown in FIG. 17 are the following parameters: start, stop, center, span, zoom in, zoom out, trace marker, peak marker, threshold level and full span. These are illustrative, and other parameters can be used as well in alternative embodiments of the present invention.

When the pointing device is used to select a parameter, the parameter appears at the top of the menu and becomes the currently selected parameter. In FIG. 2, stop is shown being selected. When the menu is closed, for example by releasing a mouse button or removing a finger from a touchscreen display, the parameter is selected.

Figure 3:
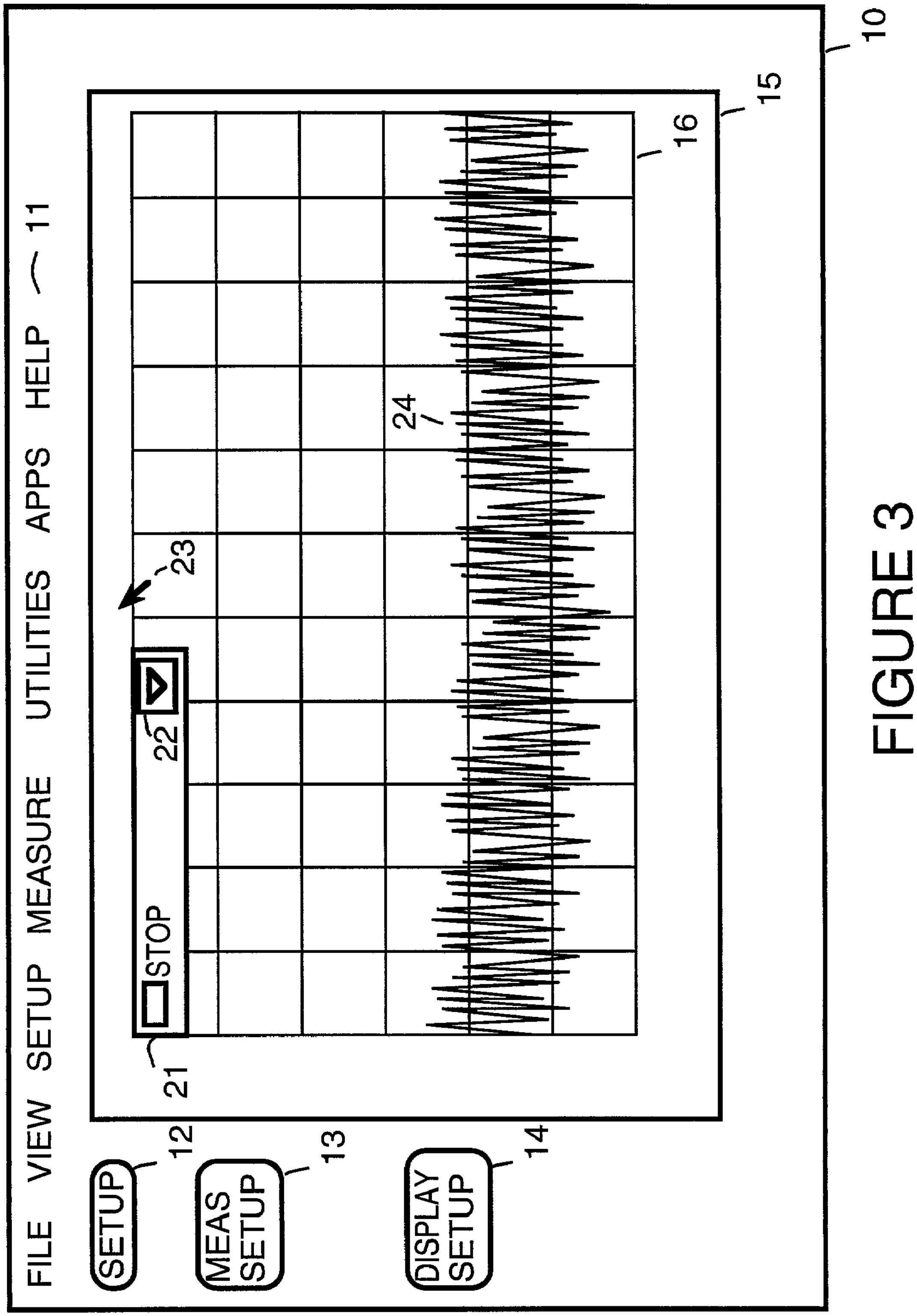
FIG. 3 shows a simplified display from a multi-wavelength meter that shows another selected parameter that may be varied using a pointing device in accordance with a preferred embodiment of the present invention.

FIG. 3, shows the selected parameter "stop" as the updated parameter shown on pull down menu 21. Once a parameter is selected the pointing device is used to vary that parameter setting for measured signal 24 displayed on grid 16. The type of variation depends on whether the pointing device is used for a discrete selection or for a drag selection. A discrete selection is, for example, made by a click of a mouse button or a tap on a touch screen. A drag is done by, for example, holding a mouse button down while moving the mouse before releasing the button. A drag is also done, for example, by dragging a finger across a touchscreen. And so on.

Figure 4:
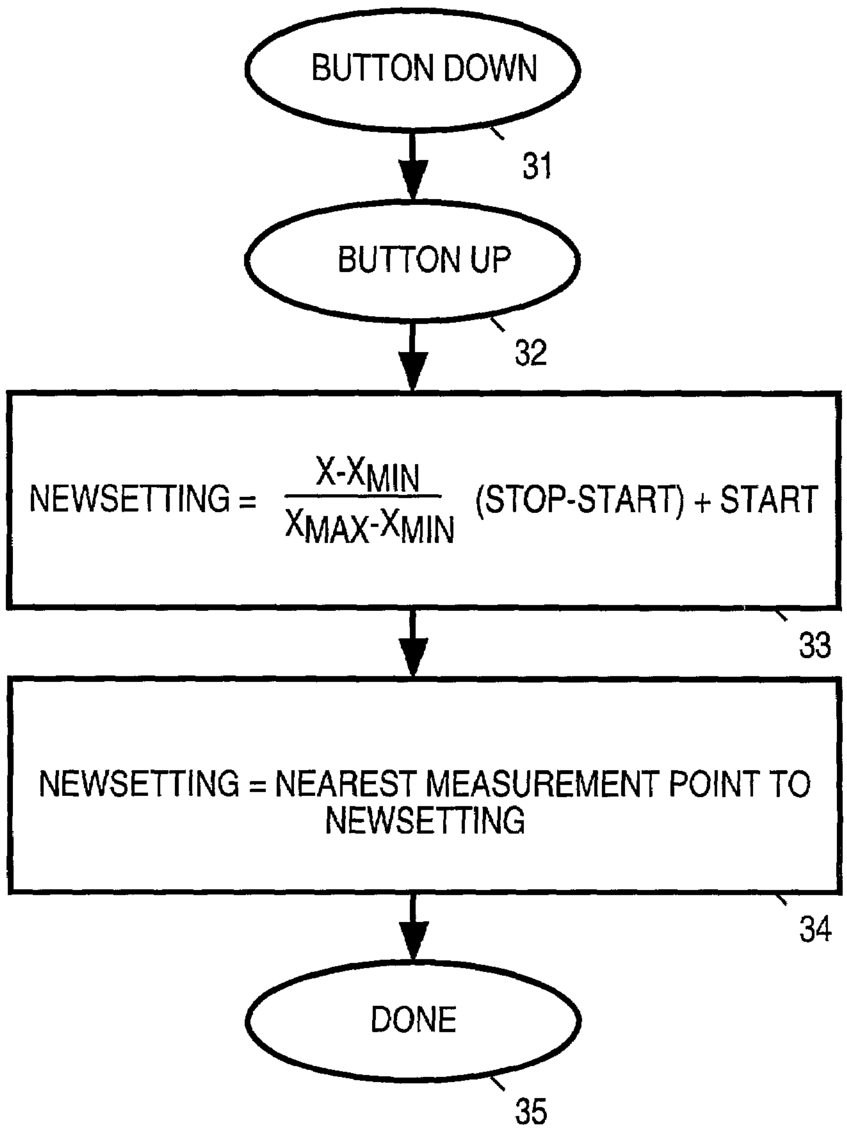
FIG. 4 is a simplified flowchart that illustrates adjustment of settings to match a corresponding location selected by a pointing device in accordance with a preferred embodiment of the present invention.

FIG. 4 is a simplified flowchart that illustrates adjustment of parameter settings such as start, stop, center and marker using a discrete selection (e.g., tapping or clicking). The discrete selection is made in a step 31 (button down) and a step 32 (button up). While in FIG. 4, the discrete selection is illustrated using clicking (button down/button up) terminology, other types of discrete selections such as tapping a finger on a touchscreen, etc., may be used to make the discrete selection.

Once the discrete selection is made, the current position "X" on the x-axis for the selected parameter is reset to match the location at which the discrete selection is made, e.g., by clicking or tapping, Once the x position for the selected parameter is reset, the displayed position of the parameter is determined. This is done in a step 33 and in a step 34.

In step 33, a new value for the parameter NEWSETTING is calculated using the formula set out in Table 1 below:

TABLE 1

$$\text{CENTER} = \frac{X - X_{MIN}}{X_{MAX} - X_{MIN}}(\text{STOP} - \text{START}) + \text{START}$$

In Table 1 above, X is the new column (x-axis) position for the parameter selected by the user. $X_{MIN}$ is the first (leftmost) column position displayed on grid 16. $X_{MAX}$ is the last (rightmost) column position displayed on grid 16. START is the value represented on grid 16 at $X_{MIN}$. STOP is the value represented on grid 16 at $X_{MAX}$. For example, START and STOP are expressed in TeraHertz.

In step 34, NEWSETTING is rounded to the nearest measurement point. The measurement points are determined by the measurement resolution of the acquisition data.

In the preferred embodiment of the present invention, parameter settings can be adjusted immediately or with animation. What is meant by animation is moving the parameter from an old setting to a new setting in incremental steps in order to give the appearance of movement. Animation has the advantage of highlighting the change in parameter values to the user. For example, six to twenty incremental steps can be used when adjusting a parameter.

Figure 5:
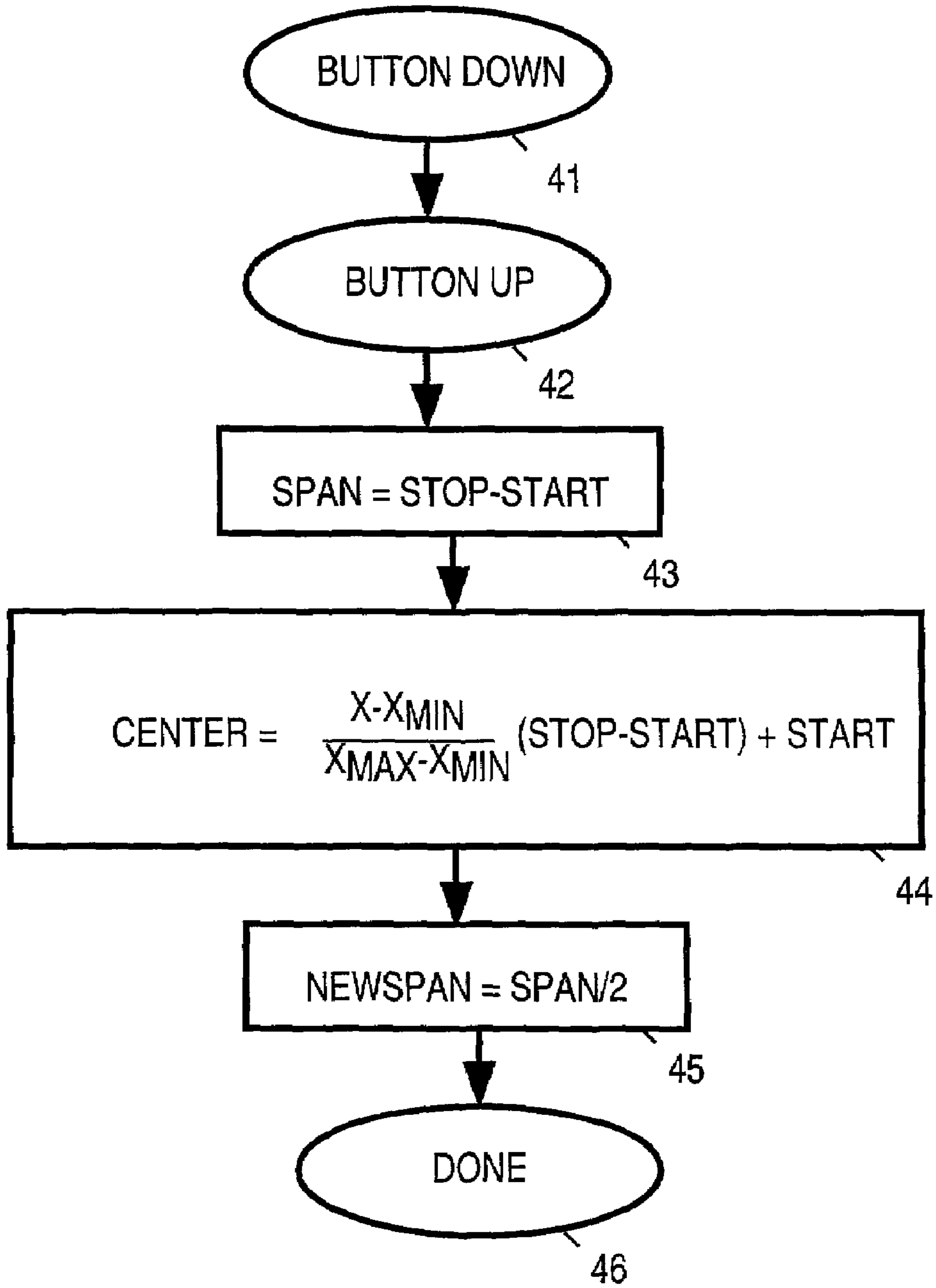
FIG. 5 is a simplified flowchart that illustrates a zoom in setting controlled by a pointing device in accordance with a preferred embodiment of the present invention.

FIG. 5 is a simplified flowchart that illustrates adjustment of the parameter setting for zoom-in when using a discrete selection (e.g., tapping or clicking). The discrete selection is made in a step 41 (button down) and a step 42 (button up).

In a step 43, a current value for SPAN is calculated. The current value is calculated as equaling the difference between STOP and START. START is the value represented on grid 16 at $X_{MIN}$. STOP is the value represented on grid 16 at $X_{MAX}$.

In a step 44, the current position "x" on the x-axis for the center of measured signal 24 is reset to match the location at which the discrete selection is made, e.g., by clicking or tapping. The displayed location of the center (CENTER) is calculated using the formula set out in Table 2 below:

TABLE 2

$$\text{CENTER} = \frac{X - X_{MIN}}{X_{MAX} - X_{MIN}}(\text{STOP} - \text{START}) + \text{START}$$

In Table 2 above, X is the new column (x-axis) position for the parameter selected by the user. $X_{MIN}$ is the first (leftmost) column position displayed on grid 16. $X_{MAX}$ is the last (rightmost) column position displayed on grid 16. START is the value represented on grid 16 at $X_{MIN}$. STOP is the value represented on grid 16 at $X_{MAX}$. For example, START and STOP are expressed in TeraHertz. CENTER is rounded such that START and STOP fall on the nearest measurement point.

In a step 45, the new span (NEWSPAN) is set to be one half the current span. If CENTER is less than ½ NEWSPAN distance from either the minimum position for START (MINSTART) or the maximum position for STOP (MAXSTOP), SPAN or the location of CENTER is adjusted as needed so that CENTER is at least ½ NEWSPAN distance from both MINSTART and MAXSTOP. In a step 46 the process is complete.

Figure 6:
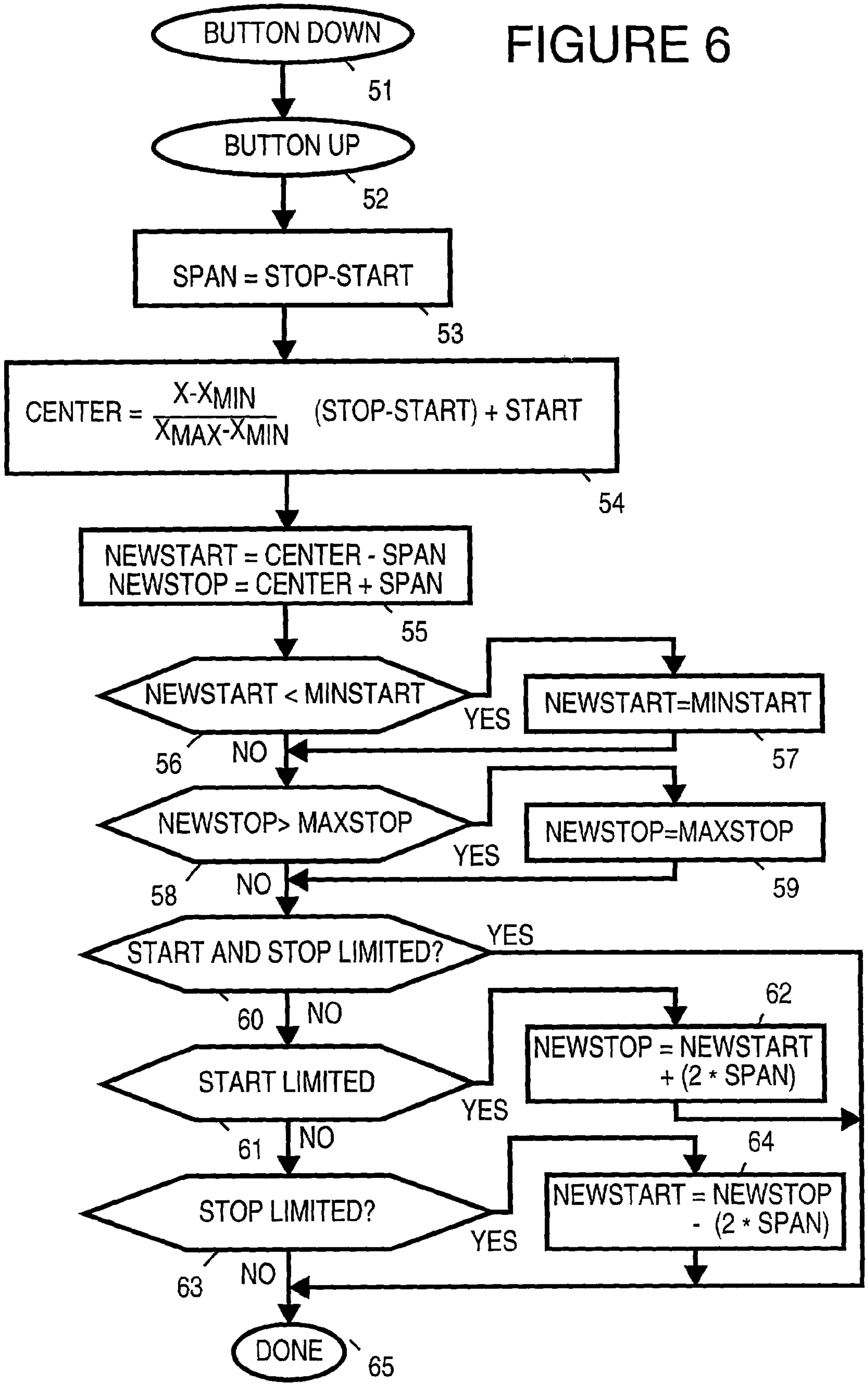
FIG. 6 is a simplified flowchart that illustrates a zoom out setting controlled by a pointing device in accordance with a preferred embodiment of the present invention.

FIG. 6 is a simplified flowchart that illustrates adjustment of parameter setting for zoom out using a discrete selection (e.g., tapping or clicking). The discrete selection is made in a step 51 (button down) and a step 52 (button up).

In a step 53, a current value for SPAN is calculated. The current value is calculated as equaling the difference between STOP and START. START is the value represented on grid 16 at $X_{MIN}$. STOP is the value represented on grid 16 at $X_{MAX}$.

In a step 54, the current value for the center of measured signal 24 is reset to match the location at which the discrete selection is made, e.g., by clicking or tapping, The value of the center (CENTER) is calculated using the formula set out in Table 3 below:

TABLE 3

$$\text{CENTER} = \frac{X - X_{MIN}}{X_{MAX} - X_{MIN}}(\text{STOP} - \text{START}) + \text{START}$$

In Table 3 above, X is the new column (x-axis) position for the parameter selected by the user. $X_{MIN}$ is the first (leftmost) column position displayed on grid 16. $X_{MAX}$ is the last (rightmost) column position displayed on grid 16. START is the value represented on grid 16 at $X_{MIN}$. STOP is the value represented on grid 16 at $X_{MAX}$. For example, START and STOP are expressed in TeraHertz. CENTER is rounded to the nearest measurement point. This is done to conform the display of the parameter to the measurement resolution.

In a step 55, the boundaries for new span (NEWSTART and NEWSTOP) are set. In steps 56 through 64, if CENTER is less than ½ NEWSPAN distance from either the minimum position for START (MINSTART) or the maximum position for STOP (MAXSTOP), the center and/or the span is adjusted as necessary.

In a step 56, a check is made to see if NEWSTART is less than MINSTART. If so, in a step 57, NEWSTART is reset to equal MINSTART.

In a step 58, a check is made to see if NEWSTOP is greater than MAXSTOP. If so, in a step 59, NEWSTOP is reset to equal MAXSTOP.

In a step 60, a check is made to see if in step 57 or step 59 adjustments were made to NEWSTART or NEWSTOP. If not, in a step 65 the process is complete.

If in step 60 it is detected that in step 57 or step 59 adjustments were made to NEWSTART or NEWSTOP, in a step 61 a check is made to see if in step 57 START was limited. If so, in a step 62, NEWSTOP is set to equal NEWSTART+(2*SPAN). If the value for NEWSTOP is greater than MAXSTOP, then NEWSTOP is set equal to MAXSTOP.

In a step 63 a check is made to see if in step 59 STOP was limited. If so, in a step 64, NEWSTART is set to equal NEWSTOP−(2*SPAN). If the value for NEWSTART is less than MINSTART, then NEWSTART is set equal to MINSTART. In step 65 the process is complete.

Figure 7:
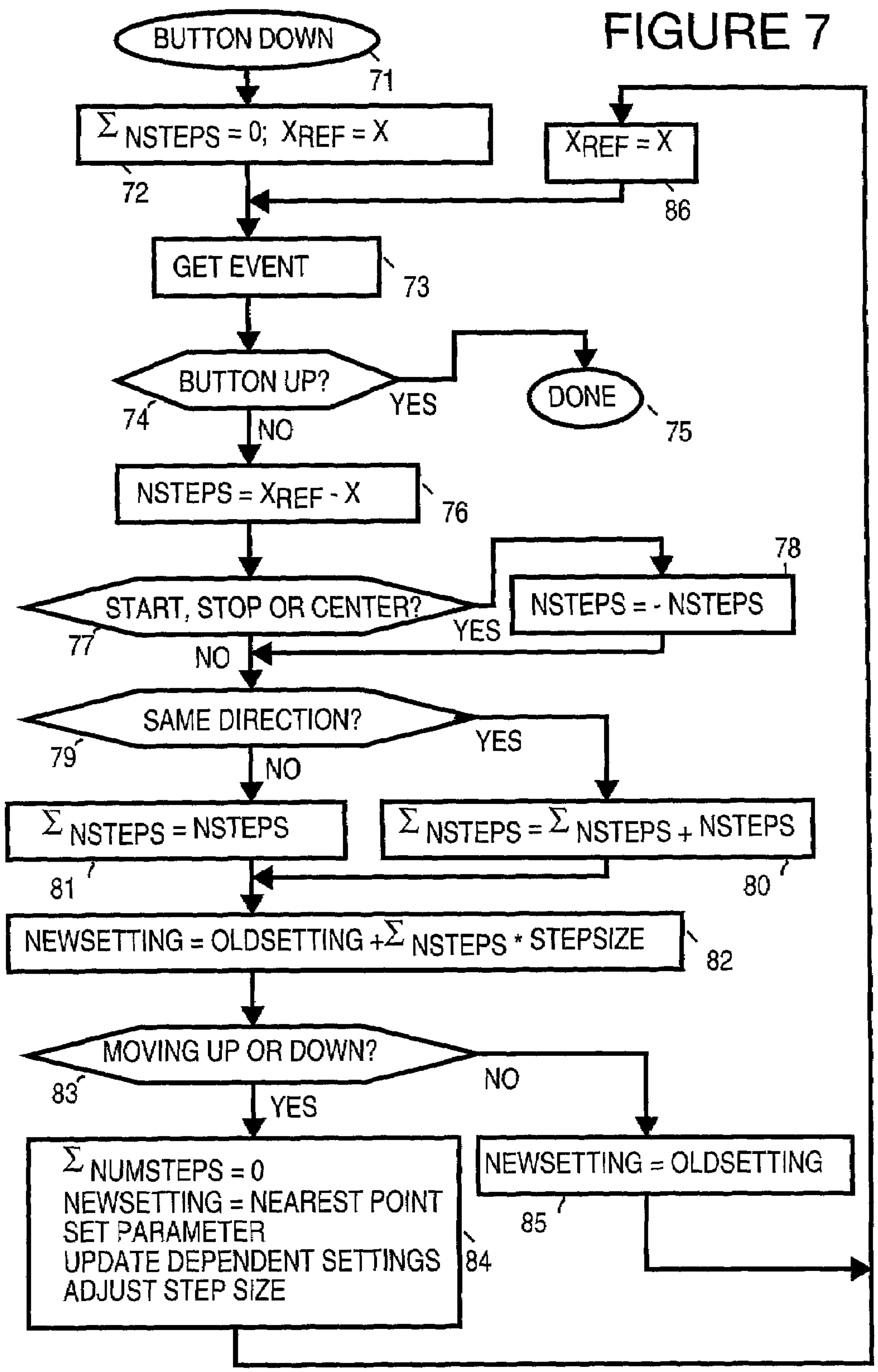
FIG. 7 is a simplified flowchart that illustrates adjustment of settings to match a corresponding location using a drag maneuver by a pointing device in accordance with a preferred embodiment of the present invention.

FIG. 7 is a simplified flowchart that illustrates adjustment of parameter settings such as start, stop, center and marker using a drag selection. In alternative embodiments of the present invention this can be implemented as in the flowchart FIG. 4 where the final point of the drag is substituted for the click point in FIG. 4. In the flowchart shown in FIG. 7, however, adjustments to display 10 can be made as the user is dragging, thus giving real time feedback to the user of the changes that are being made.

In a step 71, the drag is started upon button down plus movement. While in FIG. 7, the drag selection is illustrated using button down, movement, button up terminology, other types of drag selections such as dragging a finger on a touchscreen, etc., may be used to make the dragging selection.

In a step 72, a variable ($\Sigma_{NSTEPS}$) is reset to 0. The variable ($\Sigma_{NSTEPS}$) represents a number of discrete display steps based on drag distance. The length of each display step is dependent, for example, on the resolution (e.g., number columns) of display 16. Also in step 72, a variable $X_{REF}$ is set equal to the pointing device's current position "X" on the x-axis.

In a step 73 an event is waited for. For example, the event is either a continuation of the drag or the completion of the drag. For example, the end of a drag is detected by a button up. Alternatively, the end of a drag is detected by a touchscreen no longer being touched.

In a step 74, a check is made to see if the drag is completed (e.g., button up). If so, in a step 75, the process is complete.

If the event is not a button up (drag complete), the event must be the continuation of the drag. The continuation of the drag means that the pointing device's current position "X" on the x-axis has changed.

In a step 76, a reference NSTEPS is set to the difference between the current position "X" and the value of the variable $X_{REF}$.

In a step 77 a check is made to see if the current parameter is START, STOP or CENTER. If so, in a step 78 the polarity of NSTEPS is reversed. This is because the parameters START, STOP and CENTER decrease with left to right movement.

In a step 79, a check is made to see if this latest event is a continuation of a prior move in the same direction. This is detected for example when the value of the variable NSTEPS is greater than 0 and the variable $\Sigma_{NSTEPS}$ is less than or equal to zero. This is also detected when the value of the variable NSTEPS is less than 0 and the variable $\Sigma_{NSTEPS}$ is greater than or equal to zero.

If, in step 79, the latest event is a continuation of a prior move in the same direction, in a step 80, the current value for $\Sigma_{NSTEPS}$ is increased by NSTEPS. If, in step 79, the latest event is not a continuation of a prior move in the same direction, in a step 81, the current value for $\Sigma_{NSTEPS}$ is reset to equal NSTEPS.

In a step 82, a variable NEWSETTING is set equal to the sum of a variable OLDSETTING, and the product of the variable $\Sigma_{NSTEPS}$ and a variable STEPSIZE. OLDSETTING is an immediately previous setting for the selected parameter. NEWSETTING is a new setting for the selected parameter. STEPSIZE is dependent on the SPAN.

In a step 83, a check is made to see whether the value of NEWSETTING is making progress by increasing (moving up) or decreasing (moving down). The parameter is moving down in value when NEWSETTING is below the previous measurement point and $\Sigma_{NSTEPS}$ is less than zero. The parameter is moving up in value when NEWSETTING is greater than the next measurement point and $\Sigma_{NSTEPS}$ is greater than zero.

If there is movement up or down, in a step 84, $\Sigma_{NSTEPS}$ is reset to zero. NEWSETTING is rounded to the nearest measurement point. The value for the parameter is set on grid 16. Also the dependent settings are also set on grid 16. In addition, the step size is adjusted as necessary.

If there is no movement up or down, in a step 85, NEWSETTING is set equal to OLDSETTING.

In a step 86, the variable $X_{REF}$ is set equal to the pointing device's current position "X" on the x-axis. Then in step 73, the next event is waited for.

The foregoing discussion discloses and describes merely exemplary methods and embodiments of the present invention. As will be understood by those familiar with the art, the invention may be embodied in other specific forms without departing from the spirit or essential characteristics thereof. For example, the invention has been illustrated using variations along the x-axis. However, threshold level is varied along the y-axis. Also, in alternative embodiments, variations can be made along the x-axis and the y-axis. Accordingly, the disclosure of the present invention is intended to be illustrative, but not limiting, of the scope of the invention, which is set forth in the following claims.

I claim:

1. An electronic instrument comprising:

a display that displays a signal waveform, the signal waveform being from a signal detected by the electronic instrument and that displays a menu that shows a plurality of parameters for the displayed signal waveform;

a pointing device that allows a user to select locations on the display; and, logic within the electronic instrument that allows selection of a parameter from the plurality of parameters and that adjusts values for the parameter selected from the plurality of parameters, adjustment being made based on locations on the display selected after selection of the parameter, wherein the locations are selected by the user using the pointing device.

2. An electronic instrument as in claim 1 wherein the pointing device is at least one of the following:

a mouse;
a trackball;
a touchpad;
a touchscreen;
cursor keys.

3. An electronic instrument as in claim 1 wherein the plurality of parameters includes at least one of the following:

start location;
stop location;
center location;
displayed span;
zoom in;
zoom out;
trace marker;
peak marker;
threshold level;
full span.

4. An electronic instrument as in claim 1 wherein the menu is a pull down menu that allows the user to select parameters.

5. An electronic instrument as in claim 1 wherein the menu is a pull down menu that allows the user to select parameters, the pull down menu, when closed, displaying the selected parameter.

6. An electronic device as in claim 1 wherein the logic adjusts values for the selected parameter of the displayed signal waveform as the user makes a dragging selection using the pointing device.

7. A method comprising:

displaying a signal waveform on a display, the signal waveform being from a signal detected by an electronic instrument;

displaying a menu that shows a plurality of parameters for the displayed signal waveform; and, performing the following in response to a user selecting a parameter from the plurality of parameters and, after selecting the parameter, using a pointing device to select a location on the display:

adjusting values for the parameter selected from the plurality of parameters based on locations on the display selected by the user using the pointing device.

8. A method as in claim 7 wherein the pointing device is at least one of the following:

a mouse;
a trackball;
a touchpad;
a touchscreen;
cursor keys.

9. A method as in claim 7 wherein the plurality of parameters includes at least one of the following:
start location;
stop location;
center location;
displayed span;
zoom in;
zoom out;
trace marker;
peak marker;
threshold level;
full span.

10. A method as in claim 7 wherein the menu is a pull down menu.

11. A method as in claim 7 wherein the menu is a pull down menu, and wherein the selected parameter is displayed upon the pull down menu being closed.

12. A method as in claim 7 additionally comprising:
adjusting values for the selected parameter of the displayed signal waveform as the user makes a dragging selection using the pointing device.

13. Storage media for storing software which when run on a device that has computing capability performs a method comprising:
displaying a signal waveform on a display, the signal waveform being from a signal detected by an electronic instrument;
displaying a menu that shows a plurality of parameters for the displayed signal waveform; and,
performing the following in response to a user selecting a parameter from the plurality of parameters and, after selecting the parameter, using a pointing device to select a location on the display:

adjusting values for the parameter selected from the plurality of parameters based on locations on the display selected by the user using the pointing device.

14. Storage media as in claim 13 wherein the pointing device is at least one of the following:
a mouse;
a trackball;
a touchpad;
a touchscreen;
cursor keys.

15. Storage media as in claim 13 wherein the plurality of parameters includes at least one of the following:
start location;
stop location;
center location;
displayed span;
zoom in;
zoom out;
trace marker;
peak marker;
threshold level;
full span.

16. Storage media as in claim 13 wherein the method additionally comprises:
displaying a menu that lists possible selected parameters; and,
changing the selected parameter in response to a user selection.

17. Storage media as in claim 13 wherein the method additionally comprises:
adjusting values for the selected parameter of the displayed signal waveform as the user makes a dragging selection using the pointing device.

* * * * *